US009524827B2

(12) United States Patent
Choi

(10) Patent No.: US 9,524,827 B2
(45) Date of Patent: Dec. 20, 2016

(54) MULTILAYER CERAMIC CAPACITOR AND CIRCUIT BOARD FOR MOUNTING THE SAME

(71) Applicant: SAMSUNG ELECTRO-MECHANICS CO., LTD., Suwon-Si, Gyeonggi-Do (KR)

(72) Inventor: Woo Jin Choi, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 68 days.

(21) Appl. No.: 14/339,129

(22) Filed: Jul. 23, 2014

(65) Prior Publication Data

US 2015/0302991 A1 Oct. 22, 2015

(30) Foreign Application Priority Data

Apr. 16, 2014 (KR) .................. 10-2014-0045210

(51) Int. Cl.
*H01G 4/30* (2006.01)
*H01G 2/06* (2006.01)
*H01G 4/232* (2006.01)
*H05K 1/18* (2006.01)
*H01G 4/12* (2006.01)

(52) U.S. Cl.
CPC ............ *H01G 4/30* (2013.01); *H01G 2/065* (2013.01); *H01G 4/232* (2013.01); *H05K 1/182* (2013.01); *H05K 1/183* (2013.01); *H01G 4/12* (2013.01); *H01G 4/1227* (2013.01)

(58) Field of Classification Search
None
See application file for complete search history.

(56) References Cited

U.S. PATENT DOCUMENTS 5,155,656 A * 10/1992 Narashimhan ........... H01G 4/35
361/309
5,978,204 A * 11/1999 Stevenson ............. A61N 1/3754
361/303
6,008,980 A * 12/1999 Stevenson ................ H01G 4/35
361/302

(Continued)

FOREIGN PATENT DOCUMENTS

KR 10-2006-0134277 A 12/2006
KR 10-0714608 B1 5/2007
KR 10-2012-0119381 A 10/2012

*Primary Examiner* — Dion R Ferguson
(74) *Attorney, Agent, or Firm* — McDermott Will & Emery LLP

(57) ABSTRACT

A multilayer ceramic capacitor may include: a ceramic body in which dielectric layers having first via holes are stacked in a thickness direction; first internal electrodes having second via holes disposed in positions corresponding to those of the first via holes and exposed to at least one side surface of the ceramic body; second internal electrodes having third via holes disposed in positions corresponding to those of the first and second via holes; a via electrode passing through the first to third via holes to thereby be exposed to upper and lower surfaces of the ceramic body, and connected to the third via holes; and a first external electrode disposed on the at least one side surface of the ceramic body to be connected to a portion of the first internal electrode exposed to the exterior of the ceramic body.

8 Claims, 8 Drawing Sheets

(56) References Cited

U.S. PATENT DOCUMENTS

| | | | |
|---|---|---|---|
| 6,456,481 B1* | 9/2002 | Stevenson | A61N 1/3754 361/302 |
| 8,179,658 B2* | 5/2012 | Brendel | A61N 1/3754 333/183 |
| 2003/0081370 A1* | 5/2003 | Haskell | H01G 4/35 361/306.1 |
| 2004/0008470 A1* | 1/2004 | Azuma | H01G 2/065 361/306.1 |
| 2004/0085158 A1* | 5/2004 | Van Hoyweghen, III | H01G 4/35 333/182 |
| 2004/0233016 A1* | 11/2004 | Devoe | H01G 4/35 333/182 |
| 2006/0023397 A1* | 2/2006 | Brendel | H01G 4/35 361/302 |
| 2006/0120018 A1 | 6/2006 | Lee et al. | |
| 2006/0221543 A1* | 10/2006 | Stevenson | H01G 4/35 361/302 |
| 2006/0291138 A1 | 12/2006 | Kang et al. | |
| 2012/0268860 A1 | 10/2012 | Chung et al. | |
| 2012/0309237 A1* | 12/2012 | Marzano | A61N 1/3754 439/675 |
| 2013/0184796 A1* | 7/2013 | Marzano | A61N 1/3754 607/116 |

* cited by examiner

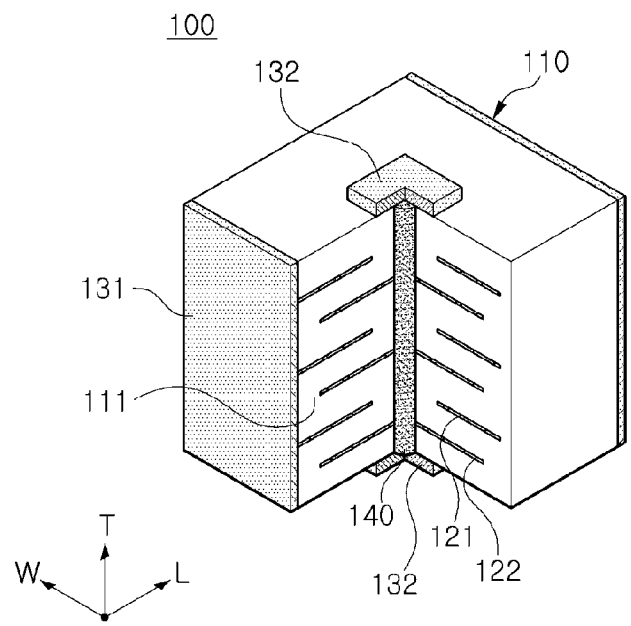
FIG. 5A
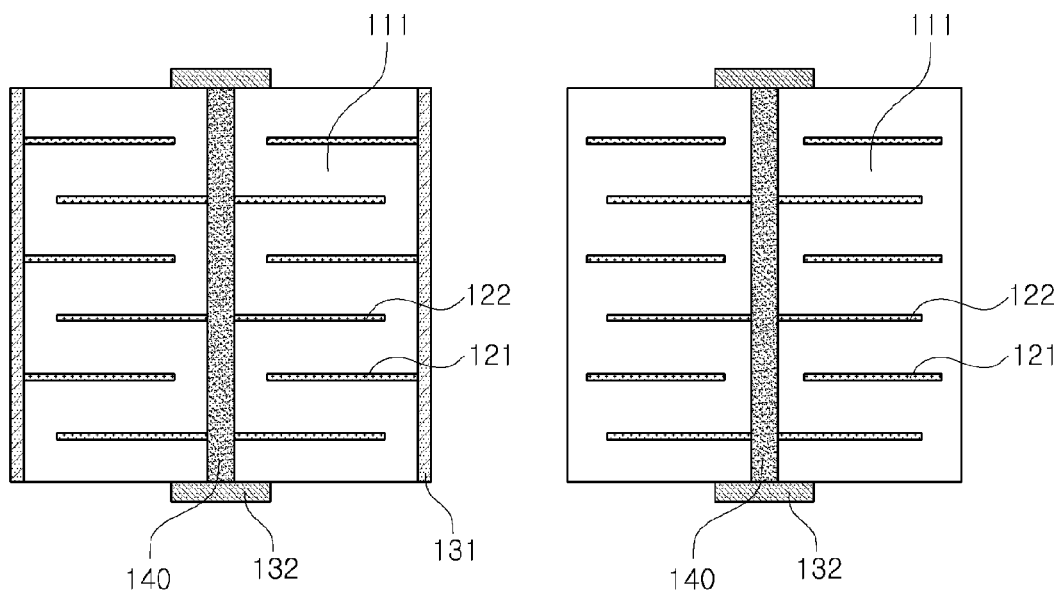
FIG. 5B
FIG. 5C

MULTILAYER CERAMIC CAPACITOR AND CIRCUIT BOARD FOR MOUNTING THE SAME

CROSS-REFERENCE TO RELATED APPLICATION

This application claims the benefit of Korean Patent Application No. 10-2014-0045210 filed on Apr. 16, 2014, with the Korean Intellectual Property Office, the disclosure of which is incorporated herein by reference.

BACKGROUND

The present disclosure relates to a multilayer ceramic capacitor (MLCC) and a circuit board for mounting the same.

A multilayer ceramic capacitor, a multilayer chip electronic component, is mounted on boards of various electronic products such as display devices including liquid crystal displays (LCDs), plasma display panels (PDPs), and the like, computers, personal digital assistants (PDAs), smart phones, mobile phones, and the like, to charge and discharge electricity.

Since multilayer ceramic capacitors (MLCCs) have advantages such as a relatively small size, high capacitance, ease of mounting, and the like, multilayer ceramic capacitors may be used as components in various electronic devices.

In the case in which a multilayer ceramic capacitor having low equivalent series resistance (ESR) is used in a power circuit, an oscillating phenomenon may occur in the power circuit due to low ESR characteristics.

In the case of increasing the ESR of the multilayer ceramic capacitor in order to prevent the oscillating phenomenon, equivalent serial inductance (ESL) may be relatively increased, and thus, electrical characteristics of the multilayer ceramic capacitor may deteriorate.

A multilayer ceramic capacitor capable of controlling ESR characteristics has been disclosed in the following Related Art Document.

RELATED ART DOCUMENT (Patent Document 1) Korean Patent Laid-Open Publication No. 2012-0119381

SUMMARY

An exemplary embodiment in the present disclosure may provide a multilayer ceramic capacitor capable of preventing deterioration in electrical characteristics due to an increase in equivalent serial inductance (ESL), and a circuit board for mounting the same.

According to an exemplary embodiment in the present disclosure, a multilayer ceramic capacitor may include: a ceramic body in which dielectric layers having first via holes are stacked in a thickness direction; first internal electrodes having second via holes disposed in positions corresponding to those of the first via holes and exposed to at least one side surface of the ceramic body; second internal electrodes having third via holes disposed in positions corresponding to those of the first and second via holes; a via electrode passing through the first to third via holes to thereby be exposed to upper and lower surfaces of the ceramic body, and connected to the third via holes; and a first external electrode disposed on the at least one side surface of the ceramic body to be connected to a portion of the first internal electrode exposed to the exterior of the ceramic body.

In addition, a diameter of the second via hole may be larger than those of the first and third via holes in order to prevent connection between the second via hole and the first internal electrode, and a dielectric part may be disposed between an inner surface of the second via hole and an outer surface of the via electrode in order to prevent connection between the via electrode and the first internal electrode.

The multilayer ceramic capacitor may further include a second external electrode disposed on at least one of the upper and lower surfaces of the ceramic body and connected to the via electrode.

The first internal electrode may be exposed to two side surfaces of the ceramic body opposing each other among side surfaces of the ceramic body, and the first external electrode may be disposed on the two side surfaces of the ceramic body to which the first internal electrode is exposed among the side surfaces of the ceramic body to thereby be connected to the first internal electrode.

The first external electrode may be disposed on all side surfaces of the ceramic body except for the upper and lower surfaces of the ceramic body or extended to portions of the upper and lower surfaces of the ceramic body.

According to another exemplary embodiment in the present disclosure, a circuit board may have a multilayer ceramic capacitor including: a ceramic body in which dielectric layers having first via holes are stacked in a thickness direction; first internal electrodes having second via holes disposed in positions corresponding to those of the first via holes and exposed to at least one side surface of the ceramic body; second internal electrodes having third via holes disposed in positions corresponding to those of the first and second via holes; a via electrode disposed in the first to third via holes and passing through the first to third via holes to thereby be exposed to upper and lower surfaces of the ceramic body; and a first external electrode disposed on the at least one side surface of the ceramic body and connected to a portion of the first internal electrode exposed to the exterior of the ceramic body.

BRIEF DESCRIPTION OF DRAWINGS

The above and other aspects, features and other advantages of the present disclosure will be more clearly understood from the following detailed description taken in conjunction with the accompanying drawings, in which:

FIG. 5A is a partially cut-away perspective view of a multilayer ceramic capacitor according to a fifth exemplary embodiment of the present disclosure;

FIG. 5B is a cross-sectional view of the multilayer ceramic capacitor of FIG. 5A taken in a T-L direction;

FIG. 5C is a cross-sectional view of the multilayer ceramic capacitor of FIG. 5A taken in a T-W direction;

DETAILED DESCRIPTION

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

Figure 1:
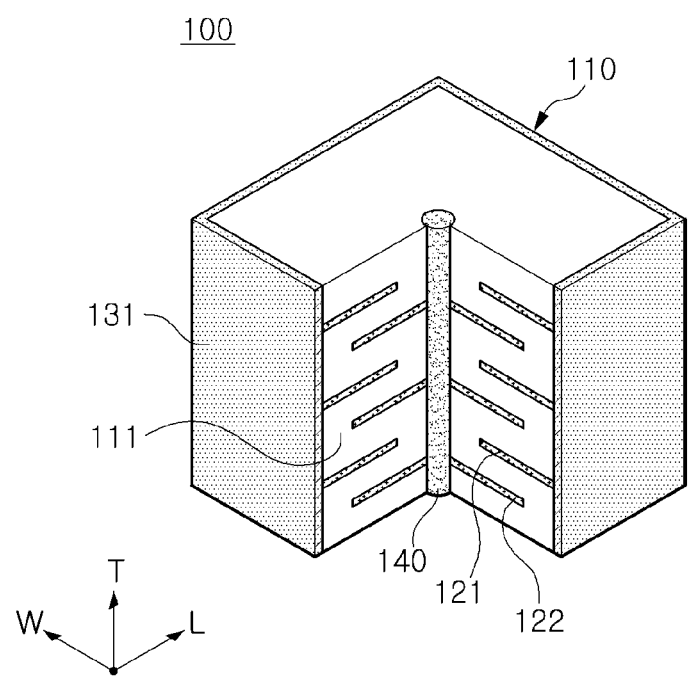
FIG. 1 is a partially cut-away perspective view of a multilayer ceramic capacitor according to a first exemplary embodiment of the present disclosure.

In the drawings, the shapes and dimensions of elements may be exaggerated for clarity, and the same reference numerals will be used throughout to designate the same or like elements Multilayer Ceramic Capacitor FIG. 1 is a partially cut-away perspective view of a multilayer ceramic capacitor according to a first exemplary embodiment of the present disclosure.

Referring to FIG. 1, a multilayer ceramic capacitor 100 according to the present exemplary embodiment may include a ceramic body 110 in which dielectric layers 111 including first via holes 151 are stacked in a thickness direction, first internal electrodes 121 including second via holes 152 disposed in positions corresponding to those of the first via holes 151 within the ceramic body 110 and exposed to at least one side surface of the ceramic body 110, second internal electrodes 122 including third via holes 153 disposed in positions corresponding to those of the first and second via holes 151 and 152 within the ceramic body 110, a via electrode 140 disposed in the first to third via holes 151 to 153, passing through the first to third via holes 151 to 153 to thereby be exposed to upper and lower surfaces of the ceramic body 110, and connected to the third via holes; and a first external electrode 131 disposed on at least one side surface of the ceramic body 110 and connected to portions of the first internal electrodes 121 exposed to the exterior of the ceramic body 110.

The ceramic body 110 may be formed by stacking the plurality of dielectric layers 111 in the thickness direction and then sintering the stacked dielectric layers 111. However, a shape and a dimension of the ceramic body 110 and the number of stacked dielectric layers 111 are not limited to those illustrated in the present exemplary embodiment.

In this case, the plurality of dielectric layers 111 forming the ceramic body 110 may be in a sintered state.

Therefore, adjacent dielectric layers 111 are integrated with each other so that boundaries therebetween are not readily apparent without using a scanning electron microscope (SEM).

Referring to FIG. 1, the ceramic body 110 may have the upper and lower surfaces to which the via electrode 140 is exposed outwardly and the side surfaces on which the first external electrode 131 is disposed.

The dielectric layers 111 may contain a ceramic material having high permittivity. For example, the dielectric layers 111 may contain a barium titanate ($BaTiO_3$) based ceramic powder, or the like. However, the material of the dielectric layers is not limited thereto as long as sufficient capacitance may be obtained.

Furthermore, if necessary, the dielectric layers 111 may contain a ceramic additive, an organic solvent, a plasticizer, a binder, a dispersant, and the like, in addition to the ceramic material. Here, various kinds of ceramic additives such as transition metal oxides or carbides, a rare earth element, magnesium (Mg), aluminum (Al), or the like, may be used.

The dielectric layer 111 may have the first via hole 151 penetrating through the dielectric layer 111. In the present exemplary embodiment, the first via hole 151 has a circular shape as shown in FIG. 1. However, the shape of the via hole is not limited thereto. The first via hole 151 may have various shapes to allow the via electrode 140 formed in the first via hole 151 to penetrate through the dielectric layer 111 and be easily electrically connected to the second internal electrode 122.

The first via hole 151 may securely hold the via electrode 140 in place in order to prevent the via electrode 140 from moving or being deformed in the ceramic body 110. To this end, an inner diameter of the first via hole 151 may be equal to an outer diameter of the via electrode 140.

The first and second internal electrodes 121 and 122 may be electrically insulated from each other by the dielectric layer 111 disposed therebetween. Each of the first and second internal electrodes 121 and 122 may be formed by printing a conductive paste containing a conductive metal on at least one surface of a ceramic sheet forming the dielectric layer 111.

The conductive metal of the conductive paste may be, for example, silver (Ag), palladium (Pd), platinum (Pt), nickel (Ni), copper (Cu), or an alloy thereof, but is not limited thereto.

In addition, as a method of printing the conductive paste, a screen printing method, a gravure printing method, or the like, may be used, but the present disclosure is not limited thereto.

The first and second internal electrodes 121 and 122 may be disposed with each of the dielectric layers 111 interposed therebetween. The first internal electrode 121 may be exposed to at least one side surface of the ceramic body 110 except for the upper and lower surfaces of the ceramic body 110. The first internal electrode 121 exposed to the side surface of the ceramic body 110 may be connected to the first external electrode 131 disposed on the side surface of the ceramic body 110.

The first internal electrode 121 may have the second via hole 152 penetrating through the first internal electrode 121. In the present exemplary embodiment, the second via hole 152 has a circular shape as shown in FIG. 1, but the second via hole 152 may have various shapes to allow the via electrode 140 to penetrate through the second via hole 152 without connection.

The second internal electrode 122 may not be exposed to the side surface of the ceramic body 110 such that it is not connected to the first external electrode 131.

The second internal electrode 122 may have the third via hole 153 penetrating through the second internal electrode 122. In the present exemplary embodiment, the third via hole 153 has a circular shape as shown in FIG. 1. However, the shape of the via hole is not limited thereto. The third via hole 153 may have various shapes to allow the via electrode 140 formed in the third via hole 153 to penetrate through the third via hole 153 while being connected thereto.

The third via hole 153 may securely hold the via electrode 140 in place in order to prevent the via electrode 140 from moving or being deformed in the ceramic body 110. To this end, an inner diameter of the third via hole 153 may be equal to the outer diameter of the via electrode 140.

The via electrode 140 may be disposed in the first to third via holes 151 to 153 and pass through the first to third via holes 151 to 153 to thereby be exposed to the upper and lower surfaces of the ceramic body 110. The via electrode 140 may be exposed to the upper and lower surfaces of the ceramic body 110, such that the multilayer ceramic capacitor 100 may include an external terminal having a vertical structure.

The via electrode 140 may be connected to an inner diameter portion of the third via hole 153 to thereby be connected to the second internal electrode 122. However, the via electrode 140 may not be connected to an inner diameter portion of the second via hole 152, such that the via electrode 140 is not connected to the first internal electrode 121.

The via electrode 140 may contain a conductive material. The conductive material contained in the via electrode 140 may be silver (Ag), palladium (Pd), platinum (Pt), nickel (Ni), and copper (Cu), or an alloy thereof, but is not limited thereto.

The first external electrode 131 may be formed of a conductive paste containing a conductive metal, but is not limited thereto.

The first external electrode 131 may be formed on the side surface of the ceramic body 110 as a power connection terminal. The first external electrode 131 of the multilayer ceramic capacitor 100 according to the first exemplary embodiment of the present disclosure as shown FIG. 1 may be disposed on at least one side surface of the ceramic body 110 except for the upper and lower surfaces of the ceramic body 110. However, the disposition of the first external electrode 131 is not limited to that in the exemplary embodiment shown in FIG. 1.

The first external electrode 131 may be connected to one end portions of the first internal electrodes 121 exposed to the side surface of the ceramic body 110 to thereby be electrically connected thereto.

The first internal electrodes 121 may be electrically connected to the first external electrode through at most four side surfaces of the ceramic body 110, and the second internal electrodes 122 may be disposed to be connected to the via electrode 140 to thereby be exposed to the upper and lower surfaces of the ceramic body 110. Such dispositions of the electrodes may shorten a current path, resulting in a reduction in equivalent serial inductance (ESL). Since the current path is diversified, electrical characteristics may be improved and noise may be reduced.

Figure 2:
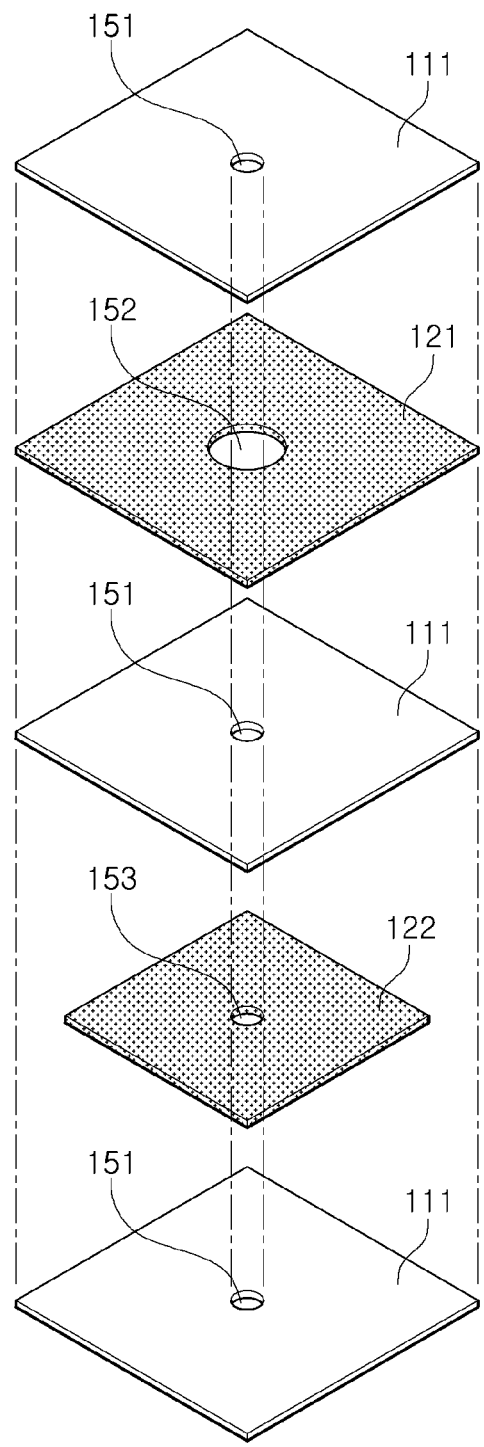
FIG. 2 is an exploded perspective view showing dielectric layers and first and second internal electrodes of a multilayer ceramic capacitor according to a second exemplary embodiment of the present disclosure.

FIG. 2 is an exploded perspective view showing dielectric layers and first and second internal electrodes of a multilayer ceramic capacitor according to a second exemplary embodiment of the present disclosure.

Referring to FIG. 2, in the multilayer ceramic capacitor 100 according to the present exemplary embodiment, the via electrode 140 may be disposed to be connected to an inner surface of the third via hole 153 to thereby be connected to the second internal electrode 122. However, the via electrode 140 may be disposed to pass through the second via hole 152 without being connected to an inner surface of the second via hole 152, such that the via electrode 140 is not connected to the first internal electrode 121. The via electrode 140 is not connected to the first internal electrode 121 but is connected to the second internal electrode 122, thereby allowing the first and second internal electrodes 121 and 122 to be connected to different current sources. Therefore, different currents may be conducted to the first and second internal electrodes 121 and 122.

Referring to FIG. 2, an area of a surface of the first internal electrode 121 may be equal to that of a surface of the dielectric layer 111. Therefore, the first internal electrode 121 may be exposed to the side surfaces of the ceramic body 110, and exposed portions of the first internal electrode 121 may be connected to the first external electrode 131.

In addition, a diameter of the second via hole 152 may be larger than those of the first and third via holes 151 and 153, such that contact between the second via hole and the first internal electrode 121 may be prevented. In the present exemplary embodiment, the first to third via holes 151 to 153 have a circular shape as shown in FIG. 2, but the shape of the via holes is not limited thereto.

Figure 3:
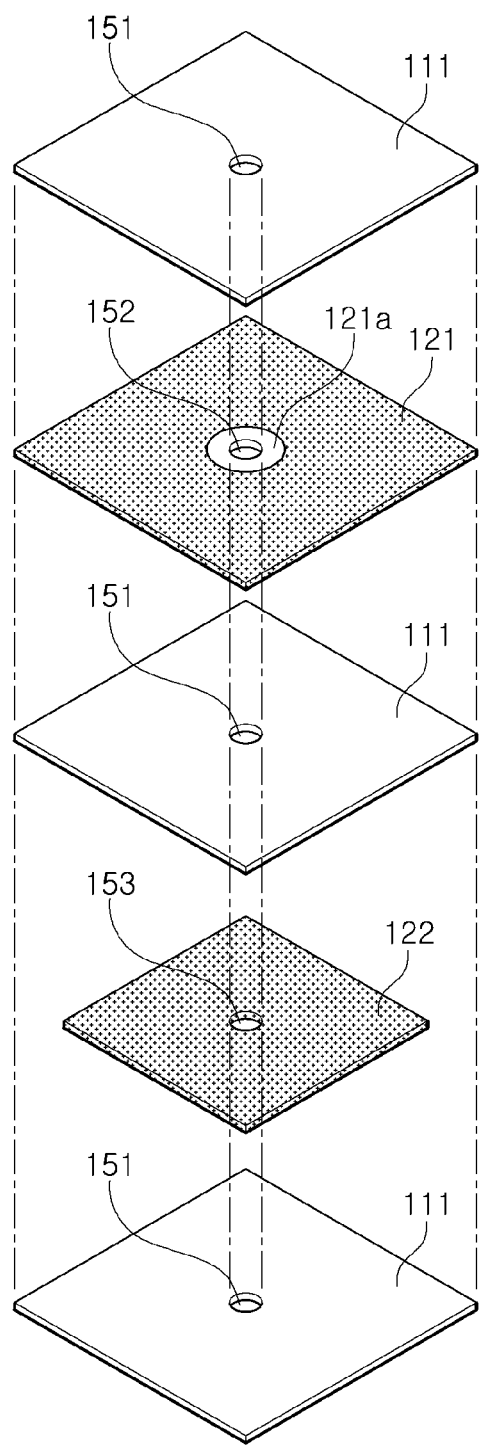
FIG. 3 is an exploded perspective view showing dielectric layers and first and second internal electrodes of a multilayer ceramic capacitor according to a third exemplary embodiment of the present disclosure.

FIG. 3 is an exploded perspective view showing dielectric layers and first and second internal electrodes of a multilayer ceramic capacitor according to a third exemplary embodiment of the present disclosure.

Referring to FIG. 3, in the multilayer ceramic capacitor 100 according to the present exemplary embodiment, in order to prevent connection between the via electrode 140 and the first internal electrode 121, a dielectric part 121*a* may be disposed between the inner surface of the second via hole 152 and the outer surface of the via electrode 140.

The dielectric part 121*a* disposed on the inner surface of the second via hole 152 may contain the same dielectric material as that contained in the dielectric layer 111. However, the present disclosure is not limited thereto.

Figure 4:
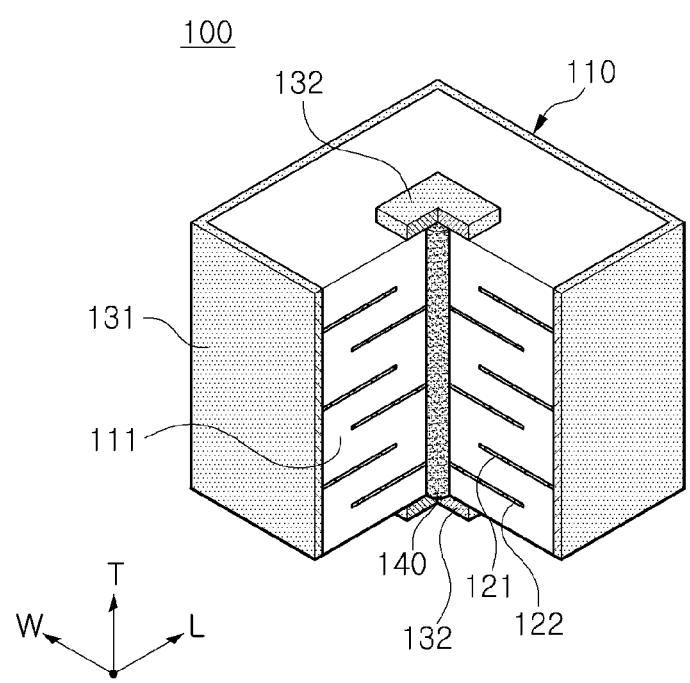
FIG. 4 is a partially cut-away perspective view of a multilayer ceramic capacitor according to a fourth exemplary embodiment of the present disclosure.

FIG. 4 is a partially cut-away perspective view of a multilayer ceramic capacitor according to a fourth exemplary embodiment of the present disclosure.

Referring to FIG. 4, the multilayer ceramic capacitor 100 according to the present exemplary embodiment may further include a second external electrode 132 disposed on at least one of the upper and lower surfaces of the ceramic body 110 to be connected to the via electrode 140.

The second external electrode 132 may be provided on at least one of the upper and lower surfaces of the ceramic body 110 as a power connection terminal. The second external electrode 132 may be connected to one end portion of the via electrode 140 exposed to the upper and lower surfaces of the ceramic body 110.

Since the via electrode 140 is connected to the second internal electrode 122, the second external electrode 132 may allow a current to flow to the second internal electrode 122 through the via electrode 140. The second external electrode 132 may be formed of a conductive paste containing a conductive metal, but is not limited thereto.

FIGS. 5A through 6B show dispositions of first internal electrodes and first external electrodes of multilayer ceramic capacitors according to exemplary embodiments of the present disclosure.

FIG. 5A is a partially cut-away perspective view of a multilayer ceramic capacitor according to a fifth exemplary embodiment of the present disclosure; FIG. 5B is a cross-sectional view of the multilayer ceramic capacitor of FIG. 5A taken in a T-L direction; and FIG. 5C is a cross-sectional view of the multilayer ceramic capacitor of FIG. 5A taken in a T-W direction.

Referring to FIGS. 5A through 5C, in the multilayer ceramic capacitor 100 according to the present exemplary embodiment, the first internal electrode 121 may be exposed to two side surfaces of the ceramic body 110 opposing each other among the four side surfaces of the ceramic body 110, and the first external electrode 131 may be disposed on the two side surfaces of the ceramic body 110 to which the first internal electrode 121 is exposed among the four side surfaces of the ceramic body 110 to thereby be connected to the first internal electrode 121.

Figure 6A:
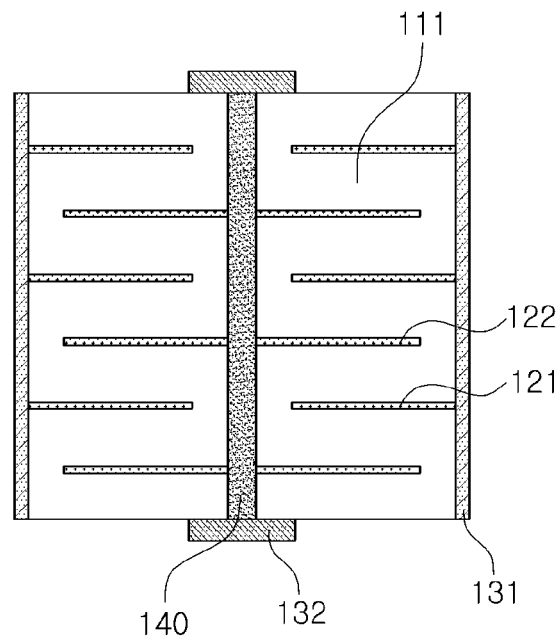
FIG. 6A is a cross-sectional view of a multilayer ceramic capacitor according to a sixth exemplary embodiment of the present disclosure taken in a T-L direction.
Figure 6B:
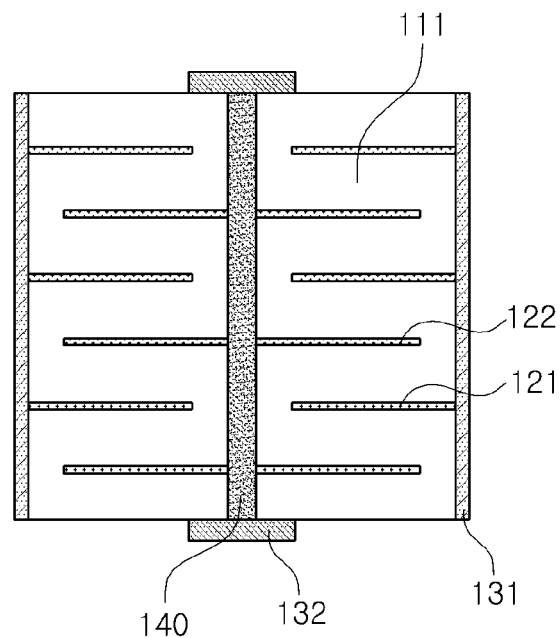
FIG. 6B is a cross-sectional view of the multilayer ceramic capacitor of FIG. 6A taken in a T-W direction.

FIG. 6A is a cross-sectional view of a multilayer ceramic capacitor according to a sixth exemplary embodiment of the present disclosure taken in a T-L direction, and FIG. 6B is a cross-sectional view of the multilayer ceramic capacitor of FIG. 6A taken in a T-W direction.

Referring to FIGS. 6A and 6B, in the multilayer ceramic capacitor 100 according to the present exemplary embodiment, the first external electrode 131 may be disposed on all side surfaces of the ceramic body 110 except for the upper and lower surfaces of the ceramic body 110 on which the second external electrode 132 is disposed. Therefore, the first external electrode 131 may be connected to the first internal electrode 121 on the four side surfaces of the ceramic body 110 except for the upper and lower surfaces of the ceramic body 110.

According to the exemplary embodiments shown in FIGS. 5A through 6B, a connection area of the first internal electrode 121 and the first external electrode 131 and a current path may be adjusted. In the case of reducing the connection area between the first internal electrode 121 and the first external electrode 131 to increase internal resistance, equivalent series resistance (ESR) may be increased. On the contrary, in the case of increasing the connection area between the first internal electrode 121 and the first external electrode 131 to decrease internal resistance, ESR may be reduced. Further, in the case of adjusting the current path to be lengthened, ESL may be increased. On the contrary, in the case of adjusting the current path to be shortened, ESL may be reduced.

The current path of the first internal electrode 121 according to the fifth exemplary embodiment shown in FIGS. 5A through 5C may be formed on the two side surfaces of the ceramic body 110, but the current path of the first internal electrode 121 according to the sixth exemplary embodiment shown in FIGS. 6A and 6B may be formed on the four side surfaces of the ceramic body 110. Therefore, ESL in the sixth exemplary embodiment of FIGS. 6A and 6B may be lower than that in the fifth exemplary embodiment of FIGS. 5A through 5C.

Figure 7A:
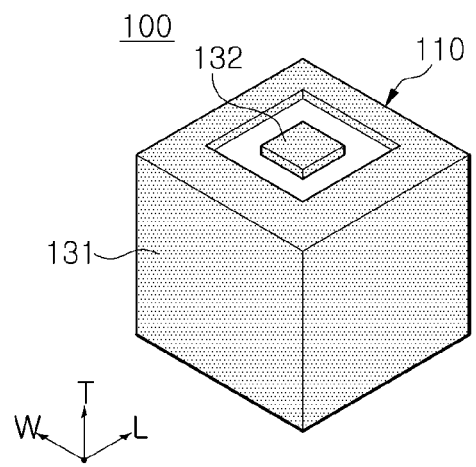
FIG. 7A is a perspective view of a multilayer ceramic capacitor according to a seventh exemplary embodiment of the present disclosure.
Figure 7B:
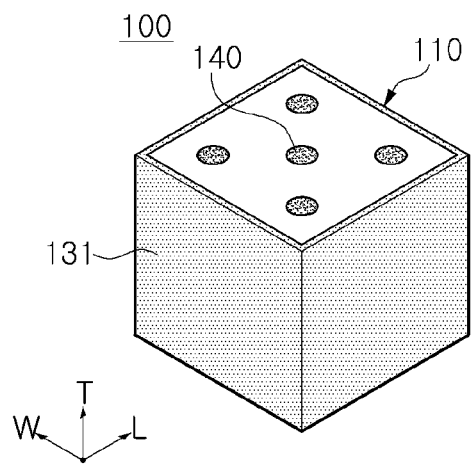
FIG. 7B is a perspective view of a multilayer ceramic capacitor according to an eighth exemplary embodiment of the present disclosure.
Figure 7C:
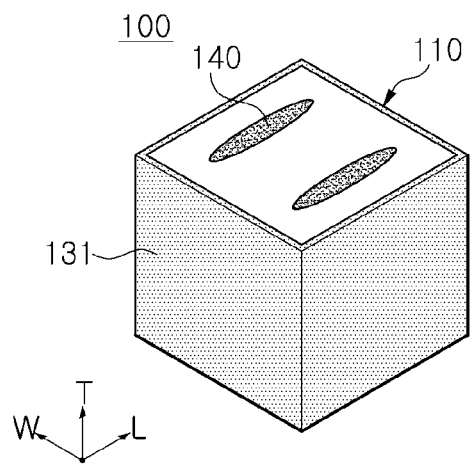
FIG. 7C is a perspective view of a multilayer ceramic capacitor according to a ninth exemplary embodiment of the present disclosure.

FIGS. 7A through 7C are perspective views of multilayer ceramic capacitors according to seventh to ninth exemplary embodiments of the present disclosure, respectively, and show modified examples of a first external electrode.

Referring to FIG. 7A, in the multilayer ceramic capacitor 100 according to the present exemplary embodiment, the first external electrode 131 may be extended to portions of the upper and lower surfaces of the ceramic body on which the second external electrode 132 is disposed.

Referring to FIGS. 7B and 7C, the multilayer ceramic capacitor 100 according to these exemplary embodiments may include two or more via electrodes 140. Five via electrodes 140 having a circular shape are shown in FIG. 7B, and two via electrodes 140 having an oval shape are shown in FIG. 7C. However, the number and the shape of via electrodes 140 are not limited to those illustrated in these exemplary embodiments.

Internal resistance between the second internal electrode 122 and the second external electrode 132 and a current path may be adjusted by changing the number and the shape of via electrodes 140.

In the case of adjusting the numbers and shapes of first to third via holes 151 to 153 and via electrodes 140 to reduce a connection area and increase internal resistance, ESR may be increased. On the contrary, in the case of adjusting the numbers and shapes of first to third via holes 151 to 153 and via electrodes 140 to reduce internal resistance, ESR may be reduced. Further, in the case of adjusting the numbers, shapes, and positions of first to third via holes 151 to 153 and via electrodes 140 to shorten a current path, ESL may be reduced. On the contrary, in the case of adjusting the numbers, shapes, and positions of first to third via holes 151 to 153 and via electrodes 140 to lengthen the current path, ESL may be increased.

In the case in which the multilayer ceramic capacitor 100 having low ESR is used in a power circuit, an oscillating phenomenon may occur in the power circuit due to low ESR characteristics. In the case of increasing the ESR of the multilayer ceramic capacitor 100 in order to prevent the oscillating phenomenon, ESL may be relatively increased, whereby electrical characteristics of the multilayer ceramic capacitor 100 may deteriorate. Therefore, ESR and ESL required in the multilayer ceramic capacitor 100 may be adjusted.

Since the current path of the multilayer ceramic capacitor 100 according to the exemplary embodiments of the present disclosure may be adjusted depending on the dispositions of the first and second internal electrodes 121 and 122, the first and second external electrodes 131 and 132, the first to third via holes 151 to 153, and the via electrode 140, the ESR of the multilayer ceramic capacitor 100 may be increased while an increase in ESL thereof may be minimized, whereby the electrical characteristics of the multilayer ceramic capacitor 100 may be improved. In addition, since the current path is diversified, the electrical characteristics may be improved and noise may be reduced.

Circuit Board for Mounting Multilayer Ceramic Capacitor

Figure 8:
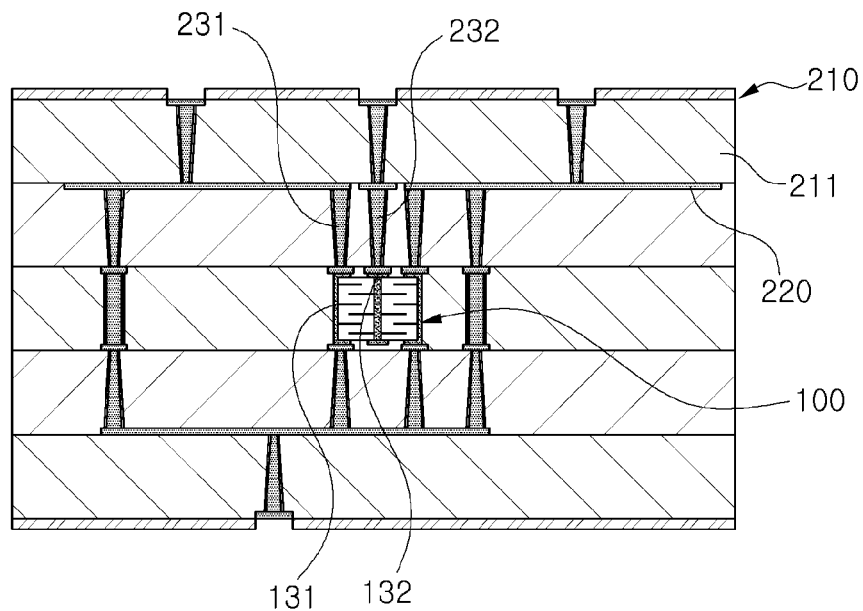
FIG. 8 is a cross-sectional view of a circuit board in which a multilayer ceramic capacitor is mounted according to a tenth exemplary embodiment of the present disclosure.

FIG. 8 is a cross-sectional view of a circuit board in which a multilayer ceramic capacitor is mounted according to a tenth exemplary embodiment of the present disclosure.

Referring to FIG. 8, a circuit board 200 in which the multilayer ceramic capacitor 100 is mounted according to the present exemplary embodiment may include a circuit board body 210 in which insulating layers 211 are stacked, a board internal electrode 220 supplying power to first and second board via electrodes 231 and 232, and the multilayer ceramic capacitor 100. Here, the first board via electrode 231 may be electrically connected to the first external electrode 131, and the second board via electrode 232 may be electrically connected to the second external electrode 132.

The first board via electrode 231 electrically connected to the first external electrode 131 may be disposed on at least one of the upper and lower surfaces of the multilayer ceramic capacitor 100 to supply power to the first external electrode 131. One or more first board via electrodes 231 may be provided in order to adjust ESR and ESL. For example, a total of eight first board via electrodes 231 may be disposed on four sides of the upper surface of the multilayer ceramic capacitor 100 and on four sides of the lower surface thereof, respectively. However, the present disclosure is not limited thereto.

The second board via electrode 232 electrically connected to the second external electrode 132 may be disposed on at least one of the upper and lower surfaces of the multilayer ceramic capacitor 100 to supply power to the second external electrode 132.

An example of the second board via electrode 232 is not limited to that illustrated in FIG. 8. In the case of a circuit board in which the multilayer ceramic capacitor 100 having no second external electrode is mounted, the second board via electrode 232 may be connected to the via electrode 140 of the multilayer ceramic capacitor 100 to supply power to the via electrode 140.

Figure 9:
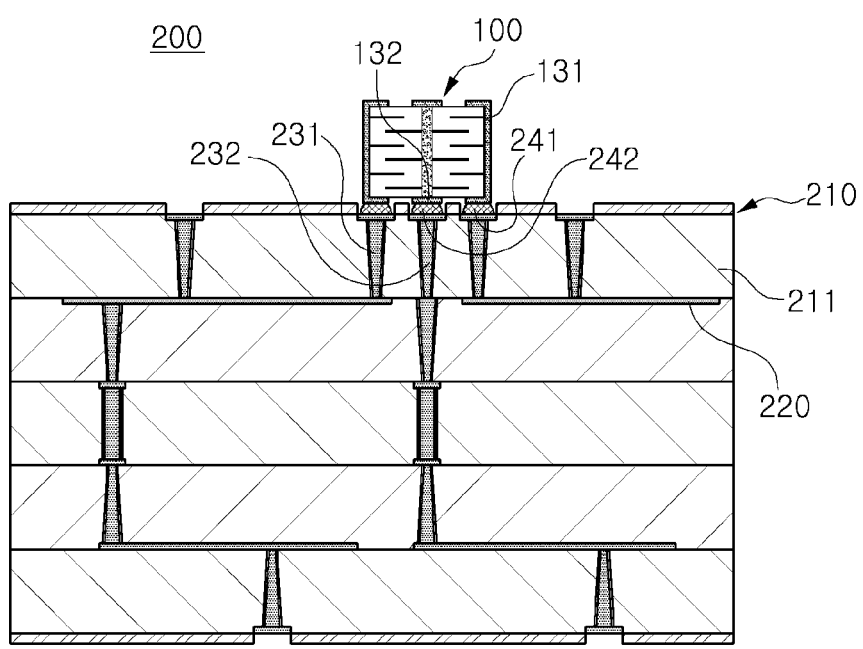
FIG. 9 is a cross-sectional view of a circuit board on which a multilayer ceramic capacitor is mounted according to an eleventh exemplary embodiment of the present disclosure.

FIG. 9 is a cross-sectional view of a circuit board on which a multilayer ceramic capacitor is mounted according to an eleventh exemplary embodiment of the present disclosure.

Referring to FIG. 9, the multilayer ceramic capacitor 100 may be disposed on an upper or lower surface of the circuit board 200.

A first electrode pad 241 may be disposed in a portion of the circuit board in which the first external electrode 131 and the first board via electrode 231 are connected to each other, allowing the first external electrode 131 and the first board via electrode 231 to be smoothly electrically connected to each other. Similarly, a second electrode pad 242 may be disposed in a portion of the circuit board in which the second external electrode 132 and the second board via electrode 232 are connected to each other.

The first board via electrode 231 may be connected to the first external electrode 131 disposed on the lower surface of the multilayer ceramic capacitor 100 through the first electrode pad 241. The second board via electrode 232 may be connected to the second external electrode 132 disposed on the lower surface of the multilayer ceramic capacitor 100 through the second electrode pad 242.

Here, since the configurations of the dielectric layers 111 of the ceramic body 110, the first and second internal electrodes 121 and 122, the first and second external electrodes 131 and 132, the via electrode 140, and the first to third via holes 151 to 153 are similar to those described in the above-mentioned exemplary embodiments, a detailed description thereof will be omitted in order to avoid redundancy.

As set forth above, in a multilayer ceramic capacitor and a circuit board for mounting the multilayer ceramic capacitor according to exemplary embodiments of the present disclosure, ESR and ESL may be controlled by adjusting internal resistance and a current path. Further, since the current path is diversified, ESL may be reduced, whereby electrical characteristics of the multilayer ceramic capacitor may be improved.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor, comprising:
a ceramic body in which dielectric layers having first via holes are stacked in a thickness direction;
first internal electrodes having second via holes disposed in positions corresponding to those of the first via holes and exposed to all of the side surfaces of the ceramic body;
second internal electrodes having third via holes disposed in positions corresponding to those of the first and second via holes;
a via electrode passing through the first to third via holes to thereby be exposed to upper and lower surfaces of the ceramic body, and connected to the third via holes; and
a first external electrode disposed on all of the side surfaces of the ceramic body to be connected to a portion of the first internal electrode exposed to an exterior of the ceramic body,
wherein the first internal electrodes are respectively disposed on a plurality of first planes, and the second internal electrodes are respectively disposed on a plurality of second planes, each of which is apart from the plurality of first planes,
wherein an area of a region defined by an outline of the first internal electrode having the second via hole is greater than that of a region defined by an outline of the second internal electrode having the third via hole, and a size of the second via hole is greater than that of the third via hole,
wherein an interior region defined by an outline of the second via hole is filled only with a combination of the via electrode and a dielectric material,
wherein an entire outer edge of the second internal electrode overlap with the first internal electrode in the thickness direction, and
wherein the second internal electrode directly contacts the via electrode.

2. The multilayer ceramic capacitor of claim 1, wherein the area of the region defined by the outline of the first internal electrode having the second via hole is equal to that of a region defined by an outline of the dielectric layer having the first via hole.

3. The multilayer ceramic capacitor of claim 1, wherein the dielectric material is disposed between an inner surface of the second via hole and an outer surface of the via electrode.

4. The multilayer ceramic capacitor of claim 1, further comprising a second external electrode disposed on at least one of the upper and lower surfaces of the ceramic body and connected to the via electrode.

5. The multilayer ceramic capacitor of claim 1, wherein the first external electrode is disposed on all side surfaces of the ceramic body but not on the upper and lower surfaces of the ceramic body.

6. The multilayer ceramic capacitor of claim 1, wherein the first external electrode extends to portions of the upper and lower surfaces of the ceramic body.

7. The multilayer ceramic capacitor of claim 1, wherein the number of via electrodes is two or greater.

8. A circuit board having a multilayer ceramic capacitor, wherein the multilayer ceramic capacitor includes:
a ceramic body in which dielectric layers having first via holes are stacked in a thickness direction;

first internal electrodes having second via holes disposed in positions corresponding to those of the first via holes and exposed to all of the side surfaces of the ceramic body;

second internal electrodes having third via holes disposed in positions corresponding to those of the first and second via holes;

a via electrode disposed in the first to third via holes and passing through the first to third via holes to thereby be exposed to upper and lower surfaces of the ceramic body; and a first external electrode disposed on all of the side surfaces of the ceramic body and connected to a portion of the first internal electrode exposed to the exterior of the ceramic body, wherein the first internal electrodes are respectively disposed on a plurality of first planes, and the second internal electrodes are respectively disposed on a plurality of second planes, each of which is apart from the plurality of first planes, wherein an area of a region defined by an outline of the first internal electrode having the second via hole is greater than that of a region defined by an outline of the second internal electrode having the third via hole, and a size of the second via hole is greater than that of the third via hole, wherein an interior region defined by an outline of the second via hole is filled only with a combination of the via electrode and a dielectric material, wherein an entire outer edge of the second internal electrode overlap with the first internal electrode in the thickness direction, and wherein the second internal electrode directly contacts the via electrode.

* * * * *